United States Patent
Wilson

[19]

[11] Patent Number: 5,841,305
[45] Date of Patent: Nov. 24, 1998

[54] CIRCUIT AND METHOD FOR ADJUSTING DUTY CYCLES

[75] Inventor: James E. Wilson, Maple Valley, Wash.

[73] Assignee: Cypress Semiconductor Corp., San Jose, Calif.

[21] Appl. No.: 821,617

[22] Filed: Mar. 20, 1997

[51] Int. Cl.$^6$ .................................................. H03K 3/017
[52] U.S. Cl. ............................ 327/175; 327/35; 327/134; 326/87
[58] Field of Search ..................................... 327/170, 172, 327/173, 174, 175, 176, 134, 31, 35, 36; 326/27, 29, 83, 87, 121

[56] References Cited

U.S. PATENT DOCUMENTS

| | | | |
|---|---|---|---|
| 4,239,992 | 12/1980 | Perkins ...................................... | 327/175 |
| 4,408,135 | 10/1983 | Yuyama et al. ............................ | 326/87 |
| 4,864,160 | 9/1989 | Abdoo ....................................... | 327/160 |
| 4,985,640 | 1/1991 | Grochowski et al. .................... | 327/175 |
| 5,103,114 | 4/1992 | Fitch ......................................... | 327/114 |
| 5,138,194 | 8/1992 | Yoeli ......................................... | 327/170 |
| 5,157,277 | 10/1992 | Tran et al. ................................. | 327/156 |
| 5,220,203 | 6/1993 | McMorrow, Jr. et al. ............... | 327/176 |
| 5,317,202 | 5/1994 | Waizman .................................. | 327/156 |
| 5,336,939 | 8/1994 | Eitrheim et al. .......................... | 327/291 |
| 5,418,485 | 5/1995 | Duret et al. ............................... | 327/172 |
| 5,448,192 | 9/1995 | Van De Wiel ............................ | 327/141 |
| 5,451,893 | 9/1995 | Anderson ................................. | 327/174 |
| 5,550,499 | 8/1996 | Eitrheim .................................... | 327/175 |
| 5,621,335 | 4/1997 | Andresen .................................. | 327/170 |
| 5,638,016 | 6/1997 | Eitrheim ................................... | 327/175 |
| 5,638,017 | 6/1997 | Kim .......................................... | 327/176 |
| 5,656,960 | 8/1997 | Holzer ...................................... | 327/170 |
| 5,687,202 | 11/1997 | Eitrheim ................................... | 375/376 |

*Primary Examiner*—Timothy P. Callahan
*Assistant Examiner*—Terry L. Englund
*Attorney, Agent, or Firm*—Maiorana & Acosta, P.C.; Christopher P. Maiorana

[57] ABSTRACT

A circuit provides a duty cycle adjustment through a gate delay for operation at various output voltage levels. The delay may be provided through an OR gate and an AND gate that will generally modulate the duty cycle received at the input since most of the strength of the predriver resides in the pullup and pulldown transistors. The circuit may operate at a number of output voltage levels, including, but not limited to, CMOS and TTL levels. The implementation of the circuit also provides the advantage of parasitic load matching that may reduce EMI.

17 Claims, 3 Drawing Sheets

CIRCUIT AND METHOD FOR ADJUSTING DUTY CYCLES

FIELD OF THE INVENTION

The present invention relates to predrivers generally and, more particularly, to a predriver for adjusting duty cycles.

BACKGROUND OF THE INVENTION

Conventional predrivers used in output pads are configured to operate at a particular voltage level. While conventional predrivers may provide the desired results in particular design applications, they generally do not provide the flexibility to be used in multiple applications. As a result, conventional predrivers are generally required to be completely and independently redesigned for each particular voltage level for which they operate. If a particular application requires more than one voltage level, two independent predrivers may be implemented side by side on a single chip. However, this generally increases the overall chip area.

Another conventional approach involves switching an additional pullup device at the output pad to increase the rise time of the output signal to increase the duty cycle. While this approach may be used when measuring the duty cycle at CMOS levels, it may undesirably increase the EMI when producing the additional pullup strength necessary to operate at TTL levels.

SUMMARY OF THE INVENTION

The present invention concerns a circuit and method that provides a duty cycle adjustment through a gate delay for operation at various output voltage levels. The delay may be provided through an OR gate and an AND gate that will generally modulate the duty cycle received at the input. Most of the strength of the present invention generally resides in the pullup and pulldown transistors which are activated. The invention may operate at a number of output voltages, including, but not limited to, CMOS and TTL levels. The implementation of the present invention also provides the advantage of parasitic load matching to reduce EMI.

The objects, features and advantages of the present invention include providing a predriver for use with an inverting output pad that provides: a duty cycle adjustment through a gate delay for operation at various output voltages and parasitic load matching that can reduce EMI.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
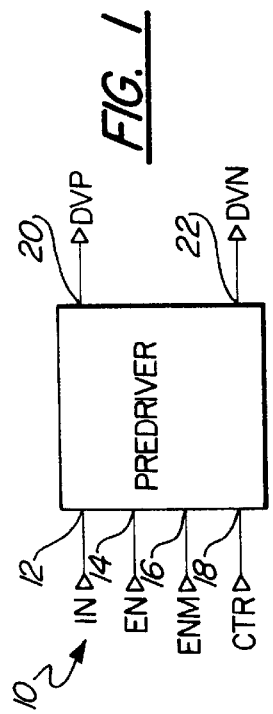
FIG. 1 is a block diagram of the predriver in accordance with a preferred embodiment of the present invention.

Referring to FIG. 1, a circuit 10 is shown in accordance with a preferred embodiment of the present invention. The circuit 10 generally comprises an input 12 which may receive a signal IN, an input 14 which may receive a signal EN, an input 16 which may receive a signal ENM, an input 18 which may receive an input CTR, an output 20 which may present a signal DVP and an output 22 which may present a signal DVN. The input signal IN may be, in one example, a reference clock with a 50% duty cycle.

Figure 2:
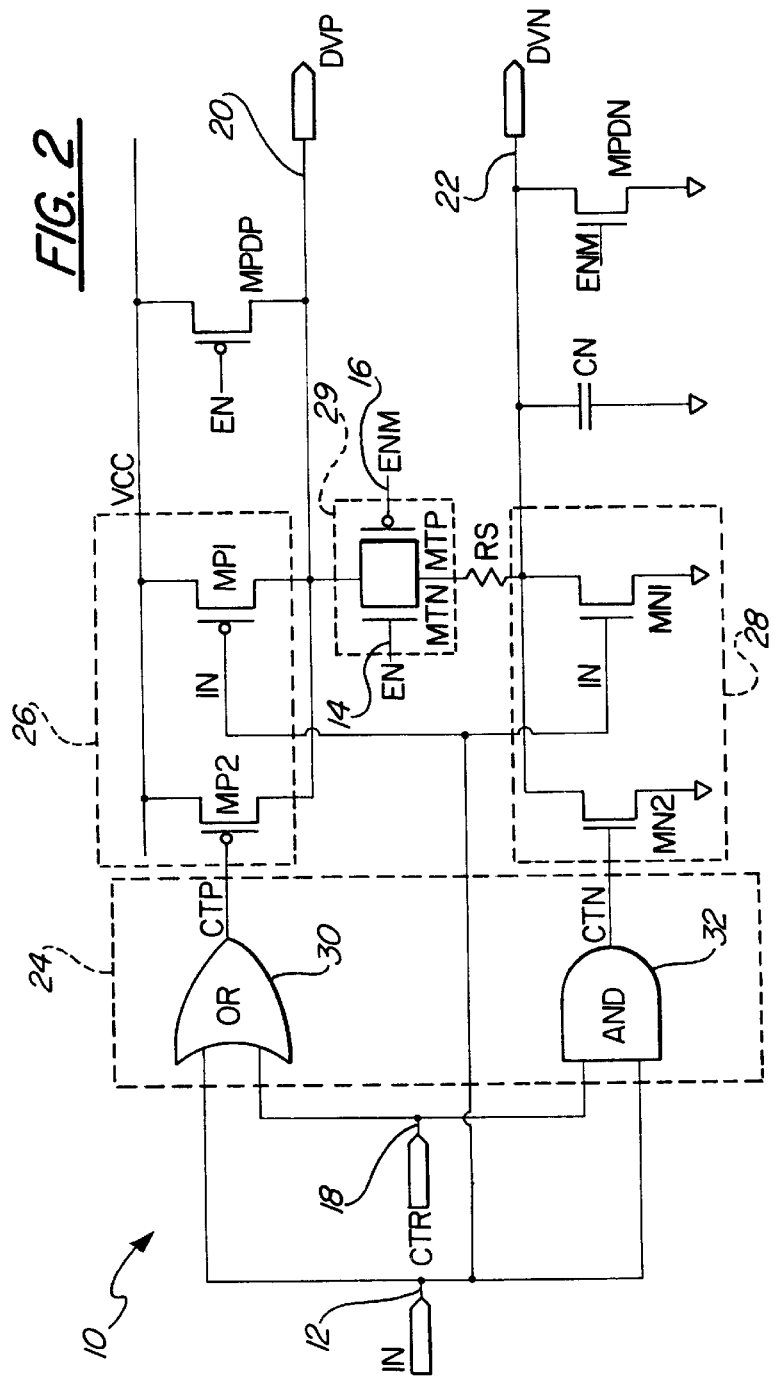
FIG. 2 is a circuit diagram of a preferred embodiment of the present invention.

Referring to FIG. 2, a more detailed diagram of circuit 10 is shown. The circuit 10 further comprises a delay section 24, a pullup section 26, a pulldown section 28 and a pass gate section 29. The delay section 24 generally comprises an OR gate 30 and an AND gate 32. The pullup section 26 generally comprises a transistor MP1 and a transistor MP2. The pulldown section 28 generally comprises a transistor MN1 and a transistor MN2. The pass gate section 29 generally comprises a transistor MTN and a transistor MTP. The circuit 10 additionally comprises a MPDP, a transistor MPDN, a resistor RS and a capacitor CN. The OR gate 30 generally receives both the signal IN as well as the signal CTR. The OR gate 30 generally presents a control signal CTP to the pullup section 26. The AND gate 32 generally receives both the signal IN as well as the signal CTR. The AND gate 32 generally presents a control signal CTN to the pulldown section 28. The sources of the transistors MP1, MP2 and MPDP are generally coupled to a supply voltage VCC. The drains of the transistors MP1, MP2 and MPDP are generally presented at the output 20 as well as to the sources of the transistors MTN and MTP. The drains of the transistors MTN and MTP are generally coupled to the sources of the transistors MN1, MN2 and MPDN through the resistor RS. The signal IN is also generally presented to the gates of the transistors MP1 and MN1. The capacitor CN generally provides coupling between the output DVN and ground. The transistors MPDP and MPDN are optional transistors that may provide a power down cutoff effect at the outputs DVP and DVN. The transistor MTN generally receives the enable signal EN at an input 14 while the transistor MTP generally receives the enable signal ENM at the input 16. The enable signal ENM is generally the complement of the enable signal EN. As a result, when the enable signal EN is active, both the transistors MTN and MTP are turned on, which connects the output DVP with the output DVN. The pullup section 26 and the pulldown section 28 are shown generally implemented as the transistors MP2 and MP1 and the transistors MN2 and MN1, respectively. The number of transistors necessary to implement the pullup section 26 and the pulldown section 28 may be adjusted to meet the design criteria of a particular application.

The input CTR generally provides a configuration input for the circuit 10. When the input CTR is high, the transistor MP2 is generally cut off and the rise time is generally determined by the pullup strength of the transistor MP1. During a pulldown, the transistors MN1 and MN2 are generally pulling down at the output with the input received at the transistor MN2 being delayed by the AND gate 32. The delay presented by the AND gate 32 has the effect of delaying the falling edge of the outputs DVN and DVP. While the delay is shown implemented as an AND gate, other gates may be substituted in order to meet the design criteria of a particular application.

When the input CTR is low, the transistor MN2 is generally cut off and the fall time for the outputs DVN and DVP is generally determined by the transistor MN1. The falling edge of the outputs DVN and DVP is generally no longer delayed, in contrast to when the input CTR is high. Additionally, the input to the transistor MP2, generally received from the OR gate 30, may be delayed by the OR gate 30. The delay introduced by the OR gate 30 has the general effect of delaying the rising edge of the outputs DVN and DVP.

The overall effect of the circuit 10 is a general increase in the duty cycle for one operating mode (e.g., a TTL operation) and a general decrease in the duty cycle for another operating mode (e.g., a CMOS operation). In an example where the circuit 10 is used as a predriver for driving an inverting output pad, the duty cycles described are generally reversed. Specifically, an increase in the duty cycle of the circuit 10 may be realized for TTL operation and a decrease in the duty cycle may be realized during CMOS operation when driving an inverting output pad. The effect of the duty cycle adjustment is generally seen at the outputs DVP and DVN.

Figure 3:
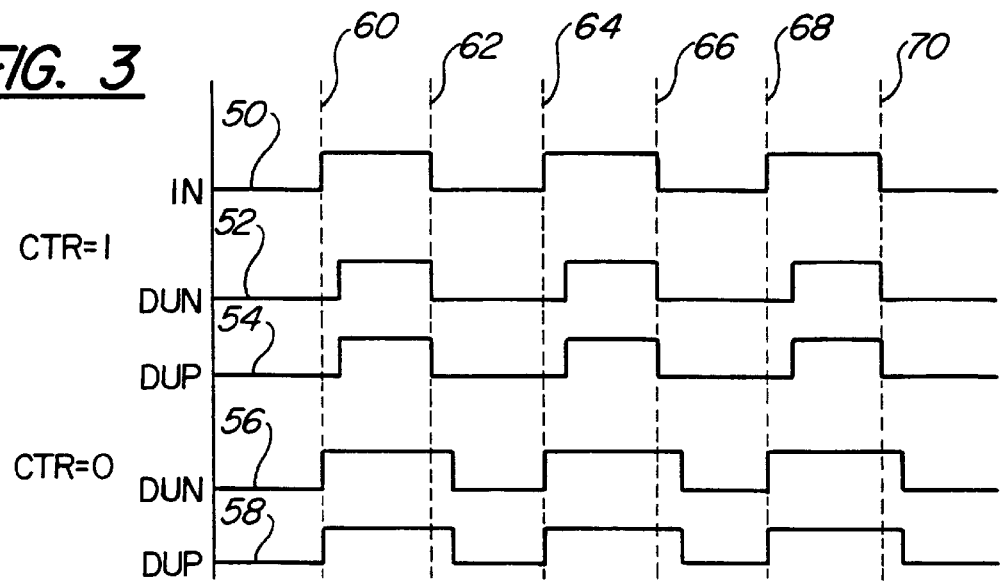
FIG. 3 is a timing diagram illustrating the operation of the present invention when receiving various inputs.

Referring to FIG. 3, a number of waveforms are shown illustrating the duty cycle adjustments described in connection with FIG. 2. FIG. 3 generally comprises a waveform 50, a waveform 52, a waveform 54, a waveform 56 and a waveform 58. The waveform 50 generally represents the input signal IN. The waveform 52 generally represents the output DVN when the input CTR is equal to one. The waveform 54 generally represents the output DVP when the input CTR is equal to one. The waveform 56 generally represents the output signal DVN when the input CTR is equal to zero. The waveform 58 generally represents the output DVP when the input CTR is equal to zero. A number of reference lines 60, 62, 64, 66, 68 and 70 provide a reference between the edges of the waveform 50 to exemplify the effect of the duty cycle adjustment. The effects of the duty cycle adjustment are seen between the waveform 50 and the waveforms 52 and 54. Additionally, a waveform 56 is shown when the input CTR is a logic low. While the effect of the duty cycle adjustment is exaggerated for clarity, the general operation of the circuit 10 is illustrated.

In addition to providing a duty cycle adjustment for different modes of operation in response to the delay section 24, reduced power consumption and lower EMI may be realized by the addition of the resistor RS and the capacitor CN. The capacitor CN generally provides a matching of the parasitic loads driven by the output signals DVP and DVN. The rise and fall times at the output signals DVP and DVN may be adjusted to fit the design criteria of a particular application. Specifically, the following Equation 1 illustrates a general sizing relationship between the transistors MP2 and MN2:

$$\beta n/\beta p=1 \qquad EQ1$$

As a result of the relationship defined in Equation 1, the width (or size) of the pullup device MP2 is generally 2.5 times the width (or size) of the pulldown device MN2. As a result, a reduction in the parasitic capacitance of the circuit 10 in the magnitude of approximately 250% is realized. However, different levels in the reduction of parasitic capacitance may be designed by adjusting the size of the transistors MP1 and MP2. The capacitor CN is generally designed to provide balance for additional parasitic capacitance that may be introduced by an output pad.

The resistor RS generally provides a delay between the rising and falling edges of the outputs DVN and DVP. The delay provided is generally large enough to allow both the pullup and pulldown devices MP2 and MN2 to have sufficient time to allow one device to turn off before the next device turns on. The particular device used to provide the delay may be adjusted to fit the design criteria of a particular application. Specifically, the delay may be accomplished by the internal resistance of the transistors MTN and MTP, which generally operate as a pass gate. However, the use of the resistor RS may provide a generally linear effect over process corners. The general slowing of the rise time of the output DVN results in a slower turn on of the pulldown devices in the output pad which generally results in lower EMI.

Figure 4:
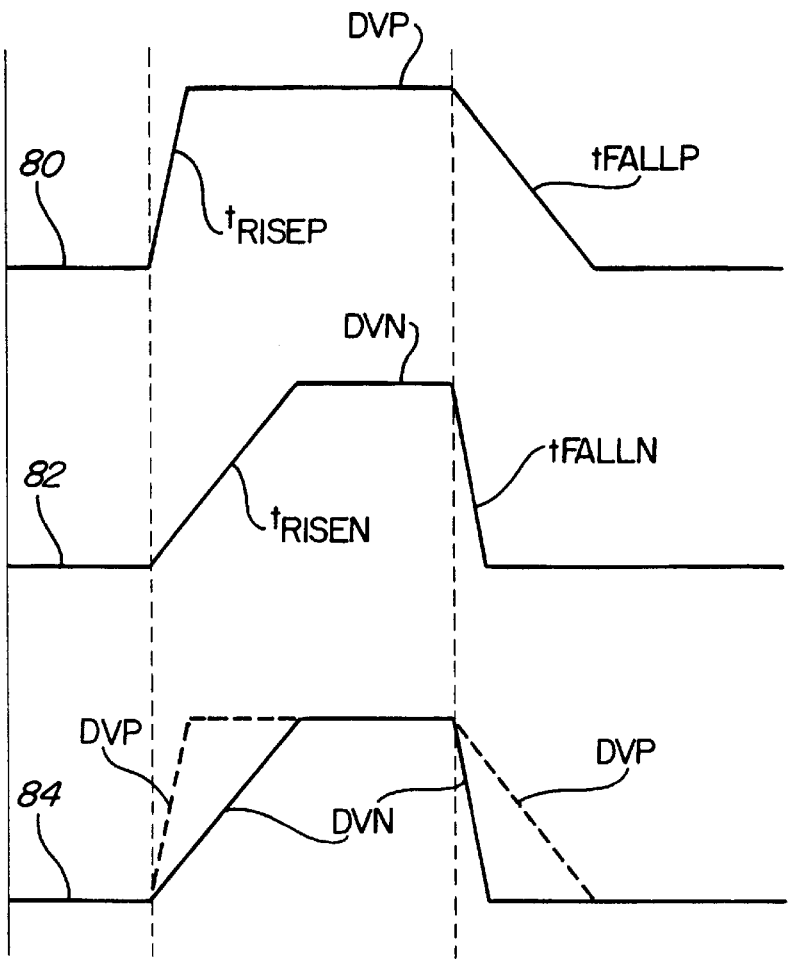
FIG. 4 is a sketch of the desired waveforms to be produced by the circuit of FIG. 2.
Figure 5:
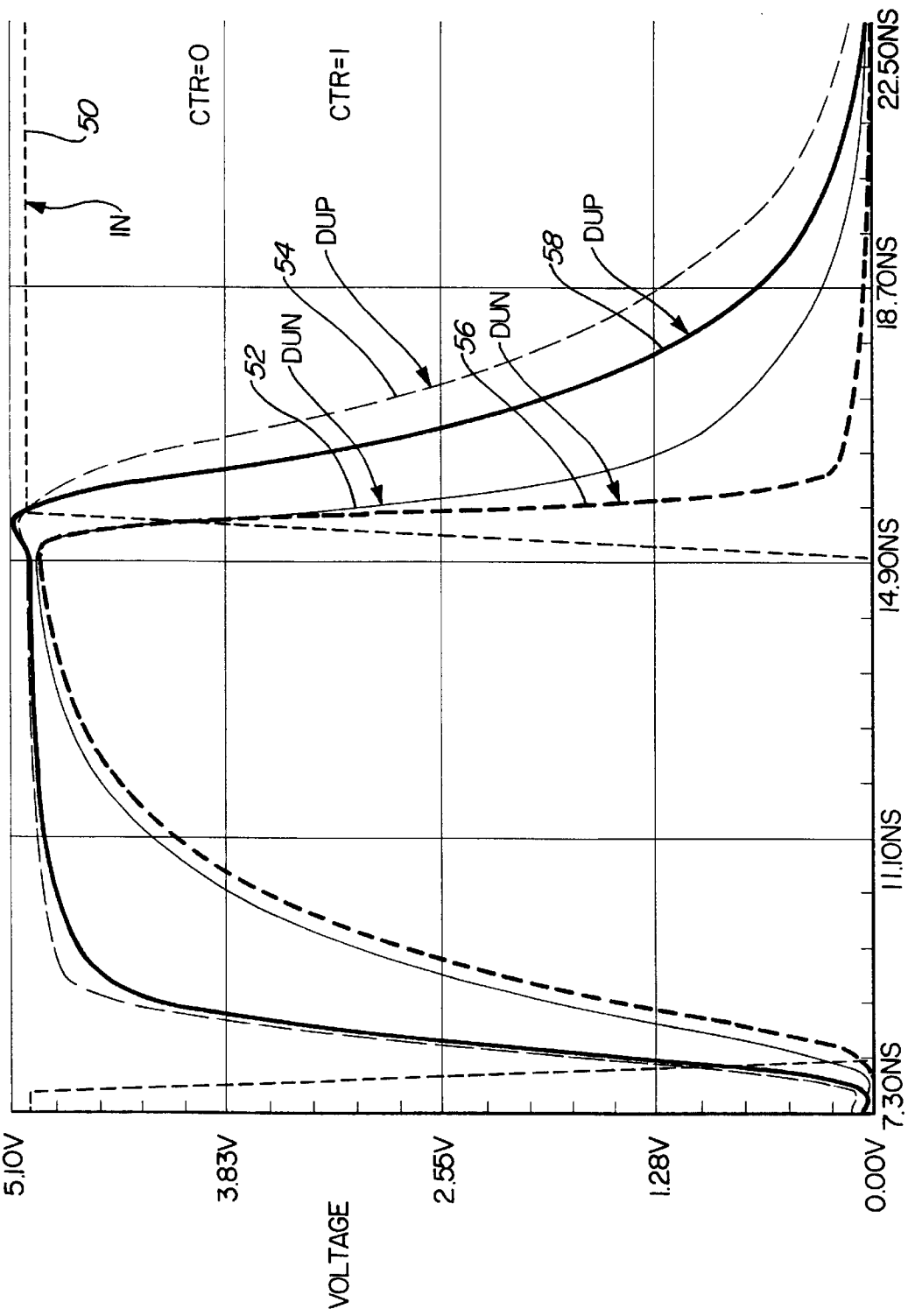
FIG. 5 is a simulation of the waveforms of FIG. 4.

Referring to FIG. 4, a sketch of a waveform 80, a waveform 82 and a waveform 84 is shown illustrating the outputs DVP and DVN. Generally, it is desirable for each of the outputs to have a rise time or DVP (e.g., $t_{RISEP}$) equal to a fall time or DVN (e.g., $t_{FALLN}$). Additionally, it is desirable for the rise time $t_{RISEP}$ to be much greater than the rise time $t_{RISEN}$, for reduced Electromagnetic Interference (EMI) of the circuit under various operating voltages. The waveform 84 is a concurrent representation of the waveform 80 and the waveform 82. Referring to FIG. 5, a simulation of the output of the circuit 10 is shown. The waveforms 52, 54, 56 and 58 are shown with respect to the input waveform 50 when the input CTR is a zero and where the input CTR is a one.

In addition to the duty cycle adjustment provided by the delay section 24, compensation for an edge rate change due to increasing and decreasing pullup and pulldown strengths may be realized by the transistors MP2 and MN2. The transistor MP2 generally increases the rise times of the outputs DVN and DVP which generally results in a larger duty cycle in the predriver and a lower duty cycle in an inverting output pad. When the transistor MN2 is off, the fall time of the outputs DVN and DVP is generally slowed, which generally results in an increase duty cycle in the predriver and a decreased duty cycle an inverting output pad. For a CMOS operation, the opposite effect is generally true. Specifically, the transistor MN2 generally increases the fall time of the outputs DVN and DVP which generally decreases the duty cycle of the circuit 10 and increases the duty cycle of an inverting output pad. By turning off the transistor MP2, the rise time of the outputs DVN and DVP are generally decreased which generally decreases the duty cycle of the circuit 10 and increases the duty cycle of an inverting output pad. However, the primary duty cycle adjustment is generally realized through the delay section 24, with the edge rates contributing additional compensation.

While the invention has been particularly shown and described with reference to the preferred embodiments thereof, it will be understood by those skilled in the art that various changes in form and details may be made without departing from the spirit and scope of the invention.

I claim:

1. A circuit comprising:
   a pullup device configured to provide a first output in response to: (i) a first input and (ii) a first control signal;
   a pulldown device configured to provide a second output in response to: (i) said first input and (ii) a second control signal; and
   a delay circuit configured to provide said first and second control signals in response to: (i) said first input and (ii) a second input, wherein said circuit provides said first and second outputs with a duty cycle adjusted with respect to said first input, in response to said second input.

2. The circuit according to claim 1, wherein said first input receives a clock.

3. The circuit according to claim 2 wherein said second input is at either: (i) a first state which causes said first and second outputs to operate at one duty cycle or (ii) a second state which causes said first and second outputs to operate at another duty cycle.

4. The circuit according to claim 1 wherein said second input comprises a configuration input.

5. The circuit according to claim 1 wherein said delay circuit comprises:

a first gate configured to receive said first and second inputs; and a second gate configured to receive said first and second inputs.

6. The circuit according to claim 5 wherein said first gate is an OR gate and said second gate is an AND gate.

7. The circuit according to claim 1 wherein:

said pullup device comprises: (i) a first pullup configured to receive said first control signal and (ii) a second pullup configured to receive said first input; and said pulldown device comprises: (i) a first pulldown configured to receive said second control signal and (ii) a second pulldown configured to receive said first input.

8. The circuit according to claim 1 is a predriver.

9. The circuit according to claim 1, further comprising a capacitor coupled to said second output to provide parasitic load matching of said second output.

10. A circuit comprising:

means for providing a first output in response to: (i) a first input and (ii) a first control signal;

means for providing a second output in response to: (i) said first input and (ii) a second control signal; and means for providing said first and second control signals in response to (i) said first input and (ii) a second input, wherein said circuit provides said first and second outputs, with a duty cycle adjusted with respect to said first input, in response to said second input.

11. The circuit according to claim 10, wherein said first input receives a clock.

12. The circuit according to claim 10 wherein said second input is at either: (i) a first state which causes said first and second outputs to operate at one duty cycle or (ii) a second state which causes said first and second outputs to operate at another duty cycle.

13. The circuit according to claim 10 wherein said second input comprises a configuration input.

14. The circuit according to claim 10 wherein said means for providing said first and second control signals comprises:

an OR gate configured to receive said first and second inputs; and an AND gate configured to receive said first and second inputs.

15. The circuit according to claim 10 wherein:

said means for providing said first output comprises:(i) a first pullup for receiving said first control signal and (ii) a second pullup for receiving said first input; and said means for providing said second output comprises: (i) a first pulldown for receiving said second control signal and (ii) a second pulldown for receiving said first input.

16. The circuit according to claim 10, further comprising a capacitor coupled to said second output to provide parasitic load matching of said second output.

17. A method for providing an output, with an adjusted duty cycle, comprising the steps of:

generating said output in response to: (i) a first input, (ii) a first control signal and (iii) a second control signal; and generating said first and second control signals in response to: (i) said first input and (ii) a second input, wherein said duty cycle is different than a duty cycle of the first input, in response to said second input.

* * * * *